United States Patent
Mandelman et al.

(10) Patent No.: US 6,605,838 B1
(45) Date of Patent: Aug. 12, 2003

(54) PROCESS FLOW FOR THICK ISOLATION COLLAR WITH REDUCED LENGTH

(75) Inventors: Jack A. Mandelman, Flat Rock, NC (US); Rama Divakaruni, Ossining, NY (US); Gerd Fehlauer, Unterhaching (DE); Stephan Kudelka, Ottendorf-Okrilla (DE); Uwe Schroeder, Dresden (DE); Helmut H. Tews, Unterhaching (DE)

(73) Assignees: International Business Machines Corporation, Armonk, NY (US); Infineon Technologies North America Corporation, San Jose, CA (US)

( * ) Notice: Subject to any disclaimer, the term of this patent is extended or adjusted under 35 U.S.C. 154(b) by 0 days.

(21) Appl. No.: 10/261,219

(22) Filed: Sep. 30, 2002

(51) Int. Cl.[7] .................. H01L 27/108; H01L 29/76; H01L 29/94; H01L 31/119
(52) U.S. Cl. .................. 257/305; 257/301; 257/302; 257/304; 438/241; 438/242; 438/243; 438/248
(58) Field of Search .................. 257/301, 302, 257/303, 304, 305; 438/241, 242, 243, 248

(56) References Cited

U.S. PATENT DOCUMENTS

| | | | | |
|---|---|---|---|---|
| 4,914,739 A | * | 4/1990 | Malhi | 257/302 |
| 5,519,236 A | * | 5/1996 | Ozaki | 257/302 |
| 6,441,423 B1 | * | 8/2002 | Mandelman et al. | 257/301 |
| 6,518,616 B2 | * | 2/2003 | Dyer et al. | 257/301 |
| 2002/0135008 A1 | * | 9/2002 | Hirler | 257/302 |
| 2002/0171099 A1 | * | 11/2002 | Sato et al. | 257/301 |
| 2002/0196651 A1 | * | 12/2002 | Weis | 365/100 |

* cited by examiner

Primary Examiner—Ngân V. Ngô
(74) Attorney, Agent, or Firm—Scully, Scott, Murphy & Presser; Tiffany L. Townsend

(57) ABSTRACT

A trench capacitor memory cell structure is provided with includes a vertical collar region that suppresses current leakage of an adjacent vertical parasitic transistor that exists between the vertical MOSFET and the underlying trench capacitor. The vertical collar isolation, which has a vertical length of about 0.50 μm or less, includes a first portion that is present partially outside the trench and a second portion that is present inside the trench. The first portion of the collar oxide is thicker than said second portion oxide thereby reducing parasitic current leakage.

20 Claims, 7 Drawing Sheets

PROCESS FLOW FOR THICK ISOLATION COLLAR WITH REDUCED LENGTH

FIELD OF THE INVENTION

The present invention relates to a semiconductor memory device, and more particularly to a trench storage memory cell structure having an isolation collar region that suppresses vertical parasitic current leakage, without significantly decreasing the cross-sectional area of the trench. The present invention is also directed to a method of fabricating such a trench storage memory cell structure.

BACKGROUND OF THE INVENTION

A metal oxide semiconductor field effect transistor (MOSFET) is used in forming dynamic random access memory (DRAM) cells. A DRAM circuit typically includes an array of memory cells interconnected by rows and columns, which are known as wordlines and bitlines, respectively. Reading data from, or writing data to, memory cells is achieved by activating selective wordlines and bitlines. Typically, a DRAM cell comprises a MOSFET connected to a capacitor. The capacitor includes two electrodes that are separated by a node dielectric, while the MOSFET includes a gate and diffusion regions that are referred to as either the source or drain region, depending on the operation of the transistor.

There are different types of MOSFETs known to those skilled in the art. A planar MOSFET is a transistor where a surface of the channel region of the transistor is generally parallel to the primary surface of the substrate. A vertical MOSFET is a transistor where a surface of the channel region of the transistor is perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Trench capacitors are frequently employed with DRAM cells. A trench capacitor is a three-dimensional structure formed into a Si-containing substrate. This is normally formed by etching trenches of various dimensions into the Si-containing substrate. Trenches commonly have N+doped polysilicon as one electrode of the capacitor (i.e., the storage node) and the other electrode of the capacitor is a buried plate that is formed via out-diffusion of dopants into a portion of the substrate surrounding the lower portion of the trench.

To prevent carriers from traveling through the substrate between adjacent devices, (e.g., transistors and capacitors) device isolation regions are formed between adjacent semiconductor devices. Generally, device isolation regions take the form of thick field oxide regions extending below the surface of the semiconductor substrate. The most common early technique for forming a field oxide region is via a local oxidation of silicon (LOCOS) process. LOCOS field oxidation regions are formed by first depositing a layer of nitride on the surface of the substrate and then selectively etching a portion of the nitride layer to form a mask exposing the substrate where the field oxide region will be formed. The masked substrate is then placed in an oxidizing environment and a thick oxide layer is grown at the regions exposed by the mask, forming an oxide layer extending above and below the surface of the substrate. An alternative to LOCOS field oxide regions is the use of shallow trench isolation (STI) regions. In STI, a sharply defined trench is formed in a substrate by, for example, anisotropic etching. The trench is then filled with an isolation oxide back to the surface of the substrate to provide a device isolation region. Trench isolation regions formed by STI have the advantage of providing device isolation across their entire lateral extent and of providing a more planar structure.

With continued scaling of minimum feature size in the DRAM array, reduction of the lateral dimensions (the openings) of the deep trench (DT) storage capacitor results. Further, a shift is ongoing from currently practiced cell area of $8F^2$ (F is the minimum linewidth of the feature size that can be patterned with lithography) for planar MOSFET cells to a cell area of $7F^2$ or $6F^2$ for planar and vertical MOSFET cells. This is driving the design opening of the DT capacitor from a 1:2 to a 1:1 width to length ratio. A reduction in the size opening of the storage trench makes filling the DT with conductive material more difficult. Further, the difficulty in filling the DT is also compounded since the collar isolation oxide thickness requirement does not scale significantly from generation to generation.

A typical trench storage memory cell is shown, for example, in FIG. 1. Specifically, the trench capacitor memory cell of FIG. 1 comprises substrate 10 having N+ bitline diffusion regions 12 formed therein. The substrate also includes a plurality of trench capacitor memory cells 14. Each trench capacitor memory cell includes trench capacitor 16 formed in a lower portion of the trench and vertical MOSFET 18 formed in an upper portion of the trench. The trench capacitor includes N+ buried plate diffusion 20 formed about the exterior walls of the trench, node dielectric 22 lining the interior walls of the trench, and storage capacitor node conductor 24 formed within the trench on the exposed walls of the node dielectric. The vertical MOSFET includes gate dielectric 26 formed on vertical sidewalls of the trench, and gate conductor 28 formed on the gate dielectric. The trench capacitors and the vertical MOSFET are isolated from each other by trench top oxide layer 30 and collar isolation oxide 32, yet the structures are in electrical communication through N+ buried strap diffusion region 34. It is noted that the N+ buried strap diffusion regions and the N+ bitline diffusion regions form the source/drain regions of the vertical MOSFET.

In the prior art structure, vertical parasitic transistor 36 exists on the sidewalls of the trench between the N+ buried strap diffusion regions and the N+ buried plate diffusion regions. The gate of the parasitic transistor is the storage capacitor node conductor of the capacitor, and one source/drain region is the N+ buried strap diffusion region and the other source/drain region is the N+ buried plate diffusion region. In the prior art structure, the collar oxide is not able to raise the threshold voltage of the parasitic transistor so that it does not conduct unless collar isolation oxide 32 is sufficiently thick; therefore excess current leakage may exist in typical prior art trench capacitor memory cells.

Suppression of the vertical parasitic transistor leakage required for long data retention time, between the storage node diffusion (i.e., buried-strap outdiffusion) and the N+ buried plate of the capacitor, along the DT sidewall is thickness of the collar isolation oxide and/or the minimum doping concentration in the deep portion of the array P-well. If the difficulty in filling the DT is alleviated by thinning the collar isolation oxide, then the doping concentration in the array P-well is generally increased to compensate for the thinner collar isolation oxide. However, by increasing the P-well concentration, data retention time is degraded. Also, having a very small DT opening within the collar isolation region adds to series resistance of the trench capacitor. An increased resistance limits the amount of charge that can be stored, which thereby degrades the yield of the memory chip.

Another problem with the prior art trench capacitor memory cell structure is that the vertical length of the collar isolation oxide detracts from the area where the storage capacitor can be formed and, if the collar oxide is formed by a deposition process, oxide extends into the trench, which decreases the cross-sectional area and thus increases the resistance. That is, prior art collar isolation oxides 'choke off' the cross-sectional area of the trench so that the resistance of the trench is increased. This makes it more difficult to exchange charge between the capacitor and the rest of the circuitry in the DRAM, namely the bitline.

In view of the above, there remains a need for providing a new and improved collar isolation region, which suppresses the vertical parasitic MOSFET leakage without the need for increasing the doping concentration of the array P-well. Any new collar isolation region provided should have a thick oxide length that does not detract from the cross-sectional area where the storage capacitor is made, and the collar isolation region of the trench should have increased isolation cross-sectional area.

SUMMARY OF THE INVENTION

One object of the present invention is to provide a trench storage memory cell structure that includes a collar isolation region that is capable of substantially suppressing the vertical parasitic current leakage between the buried-strap outdiffusion region and the buried plate of the capacitor.

Another object of the present invention is to provide a trench storage memory cell structure having a collar isolation region that includes a thick isolation region whose length does not significantly detract from the area wherein the storage capacitor is formed.

A further object of the present invention is to provide a trench storage memory cell structure that has a thick collar isolation region that does not substantially decrease the cross-sectional area of the trench.

An even further object of the present invention is to provide a trench storage memory cell structure having a collar isolation region which includes at least a thick thermal oxide region and a thinner abutting isolation region that comprises a deposited oxide or a low-k dielectric material.

These and other objects and advantages are achieved in the present invention by providing a short collar isolation region having a thick first portion that is present partially outside the trench and a thin second portion that is present inside the trench. The reduced length enhances the trench capacity, while the partial placement outside the trench increases the open trench diameter for trench fill and improves the trench series resistance.

One aspect of the present invention thus relates to a trench capacitor memory cell structure that comprises:

a plurality of trenches present in a semiconductor substrate, each of said plurality of trenches including a vertical transistor isolated from an underlying trench capacitor, and a vertical collar isolation region having a vertical length of about 0.50 µm or less present on sidewalls of each trench between said vertical transistor and said trench capacitor, said collar isolation region having a first portion that is present partially outside the trench and a second portion that is present inside the trench, said first portion is thicker than said second portion thereby reducing current leakage of an adjacent vertical parasitic transistor.

In one preferred embodiment of the present invention, the second portion of the collar isolation region comprises a low permittivity (i.e., low dielectric constant (k)) dielectric which serves to increase the threshold voltage of the vertical parasitic transistor. The terms "low permittivity" or "low-k" are used herein to denote a dielectric material having a dielectric constant that is less than $Si_3N_4$. It is noted that all dielectric constants are relative to a vacuum, unless otherwise noted.

Another aspect of the present invention is directed to a method of fabricating the above-mentioned trench capacitor memory cell structure. Specifically, the inventive method includes the steps of:

providing a plurality of trenches in a surface of a semiconductor substrate, each of said plurality of trenches having an upper region and a lower region, said lower region containing a trench capacitor formed therein;

forming a vertical collar isolation region in each of said trenches, said vertical collar isolation region having a vertical length of about 0.50 µm or less and a first portion that is present partially outside the trench and a second portion that is present inside the trench, said first portion is thicker than said second portion; and forming a vertical transistor above said vertical collar isolation region.

DETAILED DESCRIPTION OF THE INVENTION

Figure 1:
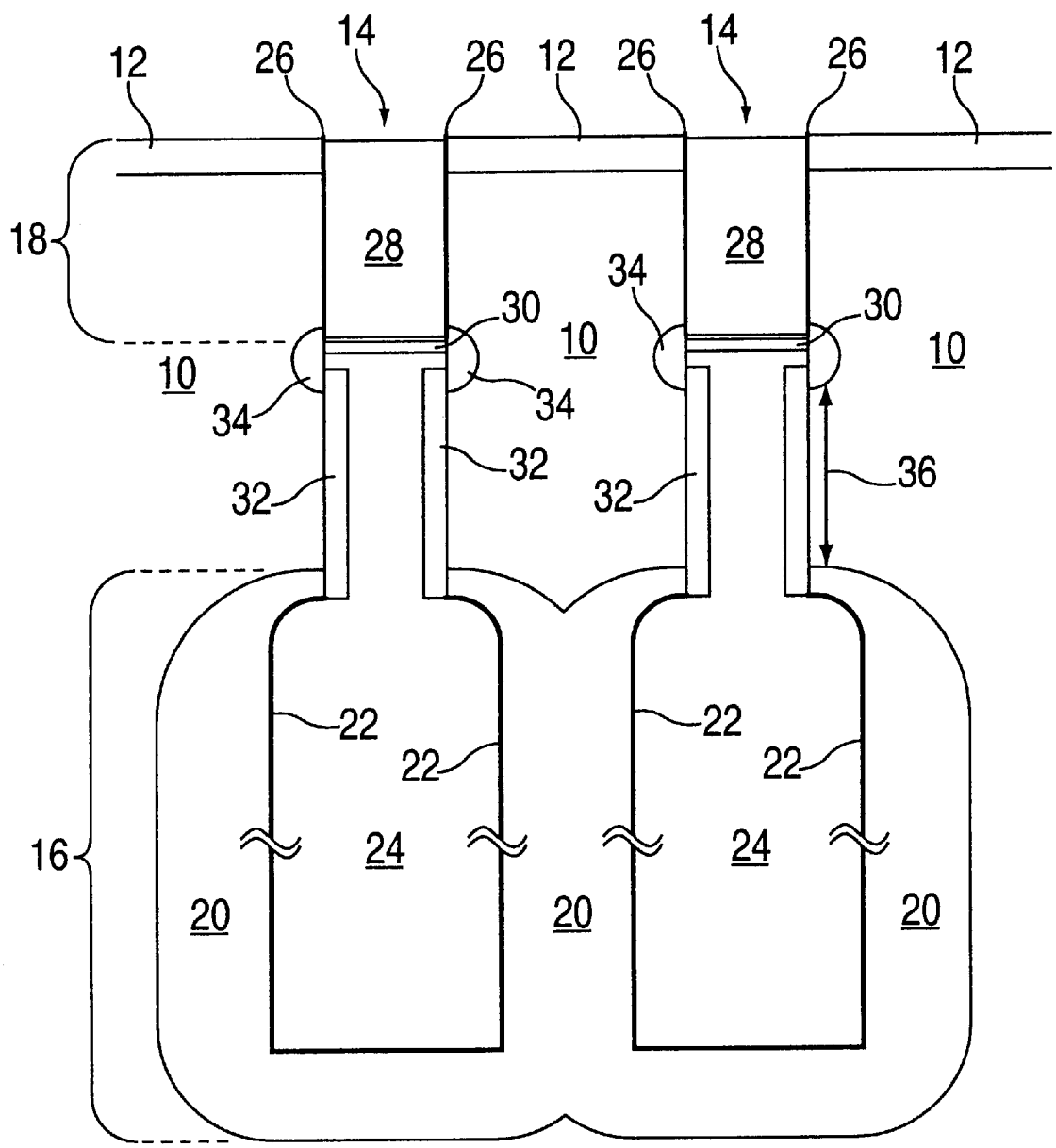
FIG. 1 is a pictorial representation (through a cross-sectional view) illustrating a typical prior art trench capacitor memory cell structure.

The present invention, which provides a novel trench capacitor memory cell structure having a short collar isolation region (of about 0.50 µm or less) which includes a first portion that is present partially outside the trench and a second portion that is present inside the trench, said first portion is thicker than said second portion, will now be described in greater detail by referring to the drawings that accompany the present application.

Figure 2:
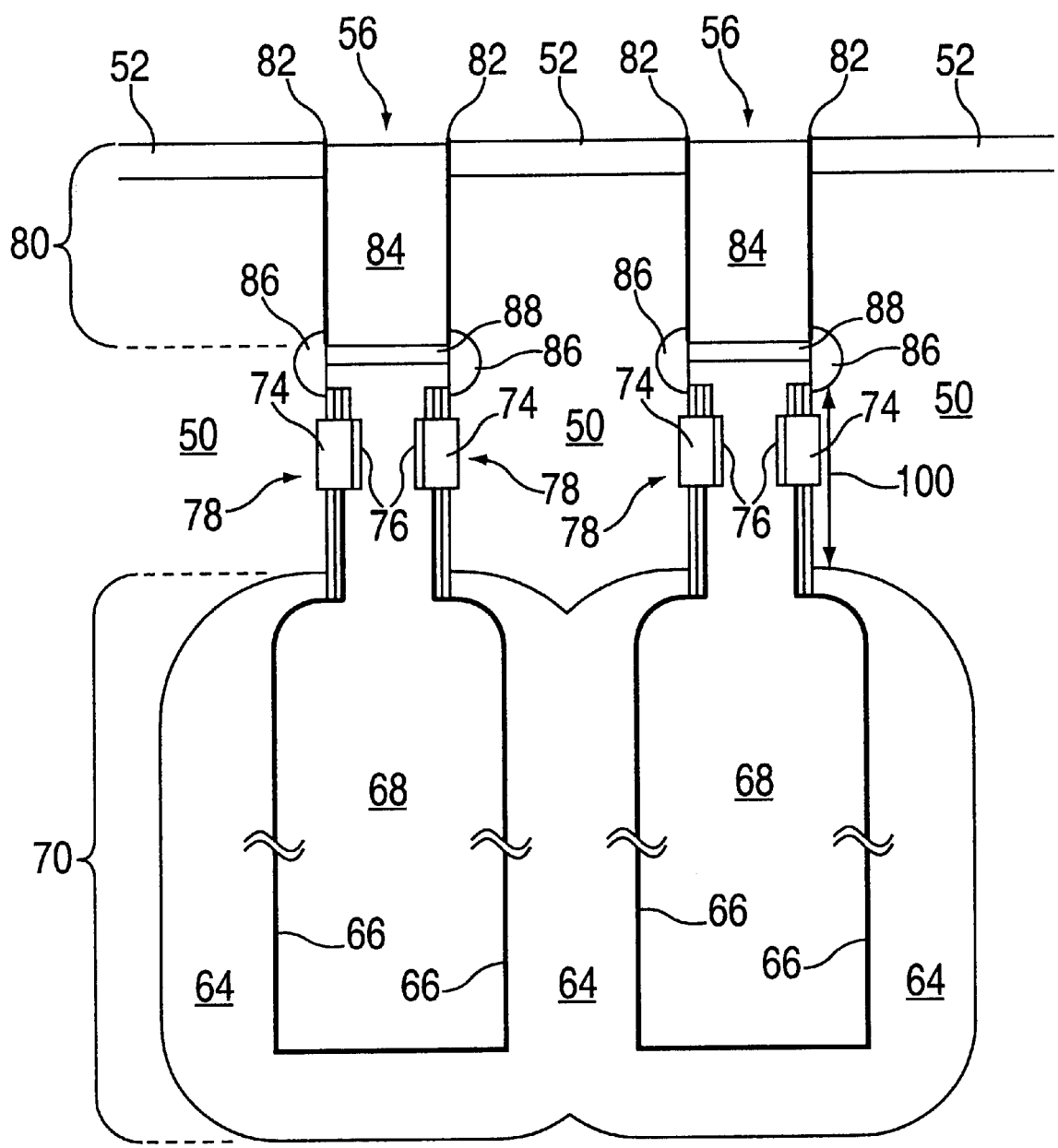
FIG. 2 is a pictorial representation (through a cross-sectional view) illustrating the trench capacitor memory cell of the present invention.

Reference is first made to FIG. 2 which is a cross-sectional view of the inventive trench capacitor memory cell structure. Specifically, the inventive memory cell comprises a plurality of trenches 56 (two of which are shown in FIG. 2) present in a surface of semiconductor substrate 50. Each of the trenches includes vertical transistor (or MOSFET) 80 which is isolated from underlying trench capacitor 70, and vertical collar isolation region 78 having a vertical length of about 0.50 µm or less present on sidewalls of each trench between the vertical capacitor and the trench capacitor. In accordance with the present invention, collar isolation region 78 includes first portion 74 that is present partially outside the trench and second portion 76 that is present inside the trench. As is shown, the first portion of the collar isolation region is thicker than the second portion of the collar isolation region thereby reducing current leakage into adjacent vertical parasitic transistor 100.

Each trench capacitor of the inventive trench capacitor memory cell illustrated in FIG. 2 includes N+ buried plate diffusion region 64 present about a broad lower portion of the trench, node dielectric 66 lining the broad lower portion of the trench, and storage capacitor node conductor 68 present on the node dielectric inside the trench.

The vertical transistor portion of the inventive trench capacitor memory cell includes vertical gate dielectric 82 lining narrow upper portions of the trench, and gate conductor 84 present inside the trench. The source/drain diffusion regions of the vertical transistor include N+ bitline diffusion region 52 and N+ buried strap region 86. The N+ buried strap region provides electrical communication between the vertical transistor and the underlying trench capacitor which are further isolated from each other by trench top oxide 88.

It is noted that the collar isolation region depicted in FIG. 2 has a sufficient thickness so as to substantially suppress parasitic current leakage. Thus, the collar isolation region of the present invention represents an improvement of prior art collar isolation regions such as depict in FIG. 1. Another feature of the inventive collar isolation region is that the vertical length of the collar isolation regions is short enough so that the collar isolation region does not detract from the trench capacitance. A further aspect of the inventive collar isolation region is that the collar isolation region is fabricated such that it does not choke off the cross-sectional area of the trench.

Reference is now made to FIGS. 3–7 which illustrate the basic processing scheme that is employed in fabricating the trench capacitor memory cell of FIG. 2. The inventive process begins with forming the structure shown in FIG. 3. Specifically, the structure shown in FIG. 3 includes semiconductor substrate 50 which has N+ bitline diffusion regions 52 present in an upper surface of the substrate. Trench regions 56 are formed into the substrate using pad layer 54 as a trench mask. The trench regions include a broad lower region and a narrow upper region which are both defined by walls. About the lower region of the trench is formed N+ buried plate diffusion region 64 and the narrow upper region of the trench includes thin sacrificial isolation collar 62.

Figure 3:
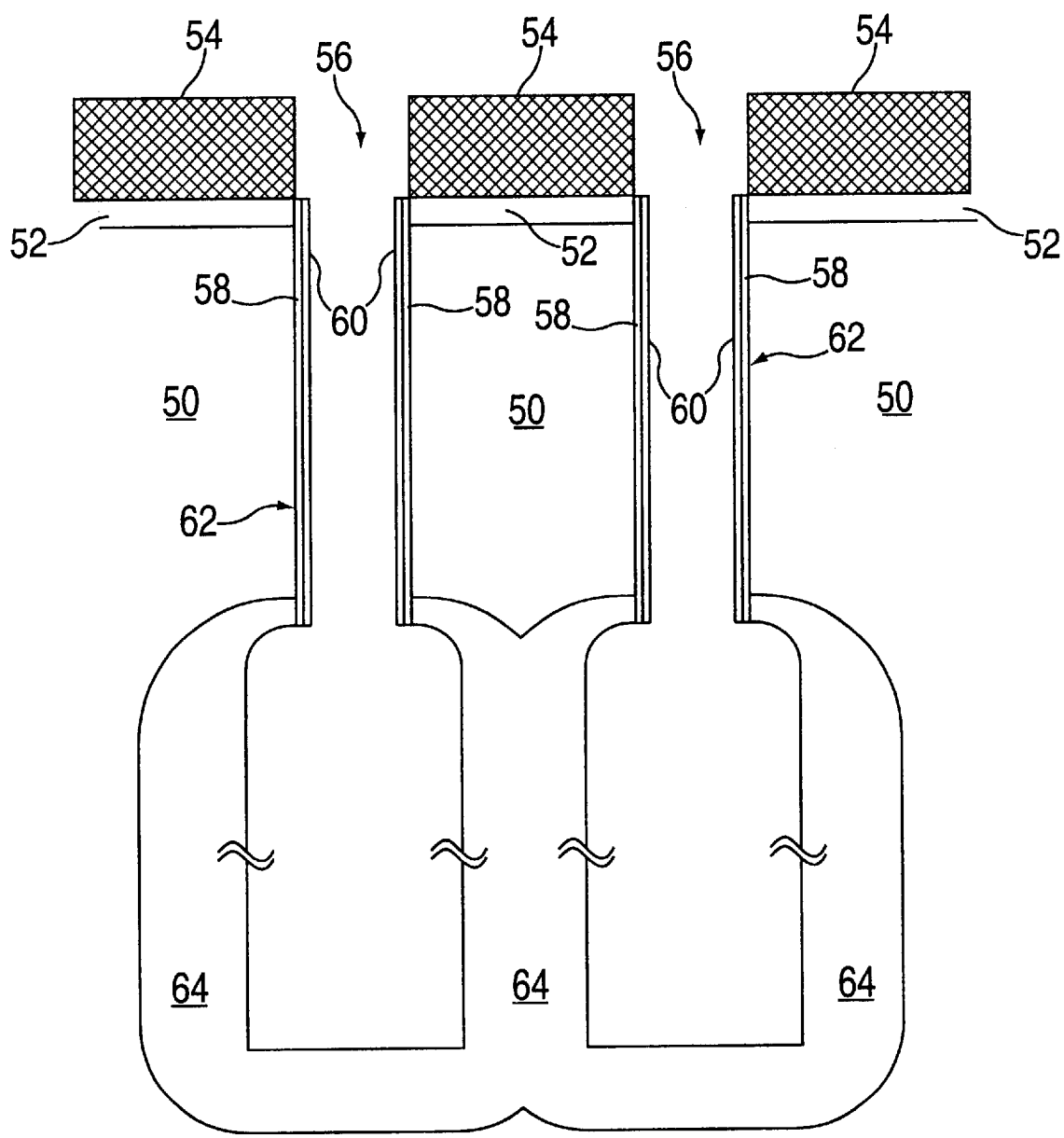
FIGS. 3–7 are pictorial representations (through cross-sectional views) illustrating the various processing steps employed in the inventive method.

The initial structure shown in FIG. 3 is composed of conventional materials well known to those skilled in the art and the following processing steps are employed in fabricating the same. Specifically, semiconductor substrate 50 is composed of any Si-containing semiconducting material including but not limited to: Si, SiGe, Si/SiGe, Si/SiO$_2$/Si, silicon-on-insulators (SOIs) and other like Si-containing semiconductor materials. The substrate may be of the n or p-type depending on the desired devices to be fabricated. Moreover, the substrate may contain various isolation and/or device regions either formed in the substrate or on a surface thereof. For clarity, these regions are not shown in the drawings, but are nevertheless meant to be included within region 50.

At this point of the present invention, N+ bitline diffusion regions 52 are formed into the surface of substrate 50 using ion implantation and activation annealing. Patterned pad layer 54 which serves as the trench mask is then formed on a surface of substrate 50 utilizing conventional processes well known to those skilled in the art including deposition and/or thermal growing followed by lithography and etching. The pad layer may comprise a single material layer, or alternatively, pad layer 54 comprises a multilayered structure. For example, the pad layer may comprise an oxide, a nitride or a doped silicate glass material, or a stack including two or more of the aforementioned materials may be employed. A preferred pad layer employed in the present invention is a multilayered structure which comprises a stack of thermal grown oxide/deposited nitride and deposited boron doped silicate glass (BSG).

As stated above, a conventional thermal deposition process such as chemical vapor deposition (CVD), plasma-assisted CVD, evaporation, or chemical solution deposition may be employed in forming the pad layer. Alternatively, pad layer 54 may be formed by a thermal oxidation or nitridation process, or a combination of thermal growing and deposition may be employed in forming the same.

Following application of pad layer 54 to the surface of substrate 50, the pad layer is then patterned using conventional lithography and etching. The lithography step employed in the present application includes the steps of applying a photoresist to the pad layer, exposing the photoresist to a desired pattern of radiation and developing the photoresist using a conventional resist developer. The pattern is then transferred into the underlying pad layer using a conventional etching process such as reactive-ion etching, ion beam etching, plasma etching or laser ablation that is highly selective in removing pad material as compared to photoresist. This etching step, which also contemplates a combination of the aforementioned etching processes, stops on an upper surface of substrate 50.

Partial etching of trenches 56 into the substrate is then performed using a conventional timed etching process that is highly selective in removing substrate as compared to the pad layer or photoresist. SiN 58 is then deposited on the exposed walls of the partially etched trench using a conventional deposition process well known to those skilled in the art. SiN layer 58 has a thickness of from about 2 to about 20 nm, with a thickness of from about 4 to about 10 nm being more highly preferred.

SiO$_2$ layer 60 is then formed atop the SiN layer using either a conventional deposition process or a conventional thermal growing process. SiO$_2$ layer 60 has a thickness of from about 2 to about 20 nm, with a thickness of from about 4 to about 10 nm being more highly preferred. It should be noted that SiN layer 58 and SiO$_2$ layer 60 form thin sacrificial isolation collar 62 shown in FIG. 3.

The horizontal surface of the thin sacrificial isolation collar formed on the bottom surface of each partially etched trench is then removed using a conventional etching process such as reactive-ion etching, and thereafter the exposed substrate is subjected to further timed etching so as to complete the formation of each trench. In the present invention, the final depth of each trench after the second timed etching process has been performed, as measured from the top surface of the substrate, is from about 4 to about 10 $\mu$m. The photoresist can be removed after any of the etching steps mentioned above.

Next, a conventional bottle etching process that is highly selective in removing substrate as compared to the sacrificial isolation collar may be performed so as to provide trenches that have a narrow upper portion and a broad lower portion. Suitable bottle etching processes that can be utilized in the present invention include the processes disclosed in U.S. Pat. No. 4,649,625 to Lu, U.S. Pat. No. 5,658,816 to Rajeevakumar; and U.S. Pat. No. 5,692,281 to Rajeevakumar, the entire contents of each being incorporated herein by reference. As shown in FIG. 3, the sidewalls of the narrow upper portion of each trench include the sacrificial isolation collar thereon.

Next, N+ buried plate diffusion region 64 is formed about the exterior walls of the broad lower trench regions using a conventional process that is capable of diffusing N+ dopant through the trench walls. One technique that can be used in forming the buried plate diffusion region is described, for example, in U.S. Pat. No. 5,395,786, the content of which is incorporated herein by reference.

Node dielectric 66 is then formed in each trench, including on sacrificial collar isolation region 62, and on the exposed trench walls in the broad lower region of each trench using either a conventional deposition process or a thermal growing process well known to those skilled in the art. Node dielectric 66 employed at this stage of the present invention comprises any dielectric material including, but not limited to: $Si_3N_4$, $SiO_2$, $Al_2O_3$, $ZrO_2$, and $RuO_2$. The thickness of node dielectric 66 may vary and is not critical to the present invention. Typically, however, node dielectric layer 66 has a thickness of from about 2.5 to about 7.0 nm, with a thickness of from about 3.0 to about 5.0 nm being more highly preferred.

Storage capacitor node conductor 68, which comprises N+ polysilicon or a metallic conductor including silicides and metallic nitrides, are then formed in each trench using a conventional deposition process and, if needed, the storage capacitor node conductor is planarized to the upper surface of pad layer 54 using a conventional planarization process such as chemical-mechanical polishing (CMP) or grinding. If storage capacitor node conductor 68 is N+ polysilicon, the N+ polysilicon may be formed using a conventional in-situ deposition process, or the N+ poly layer may be formed by layered deposition followed by gas phase or plasma immersion doping. Following deposition and optional planarization, storage capacitor node conductor 68 is recessed to a predetermined depth below the surface of the substrate using an etching process that is highly selective in removing the storage capacitor node conductor from at least an upper portion of each trench. It is noted that N+ buried plate 64, node dielectric 66, and storage capacitor node conductor 68 are the elements that make-up trench capacitor 70.

Figure 4:
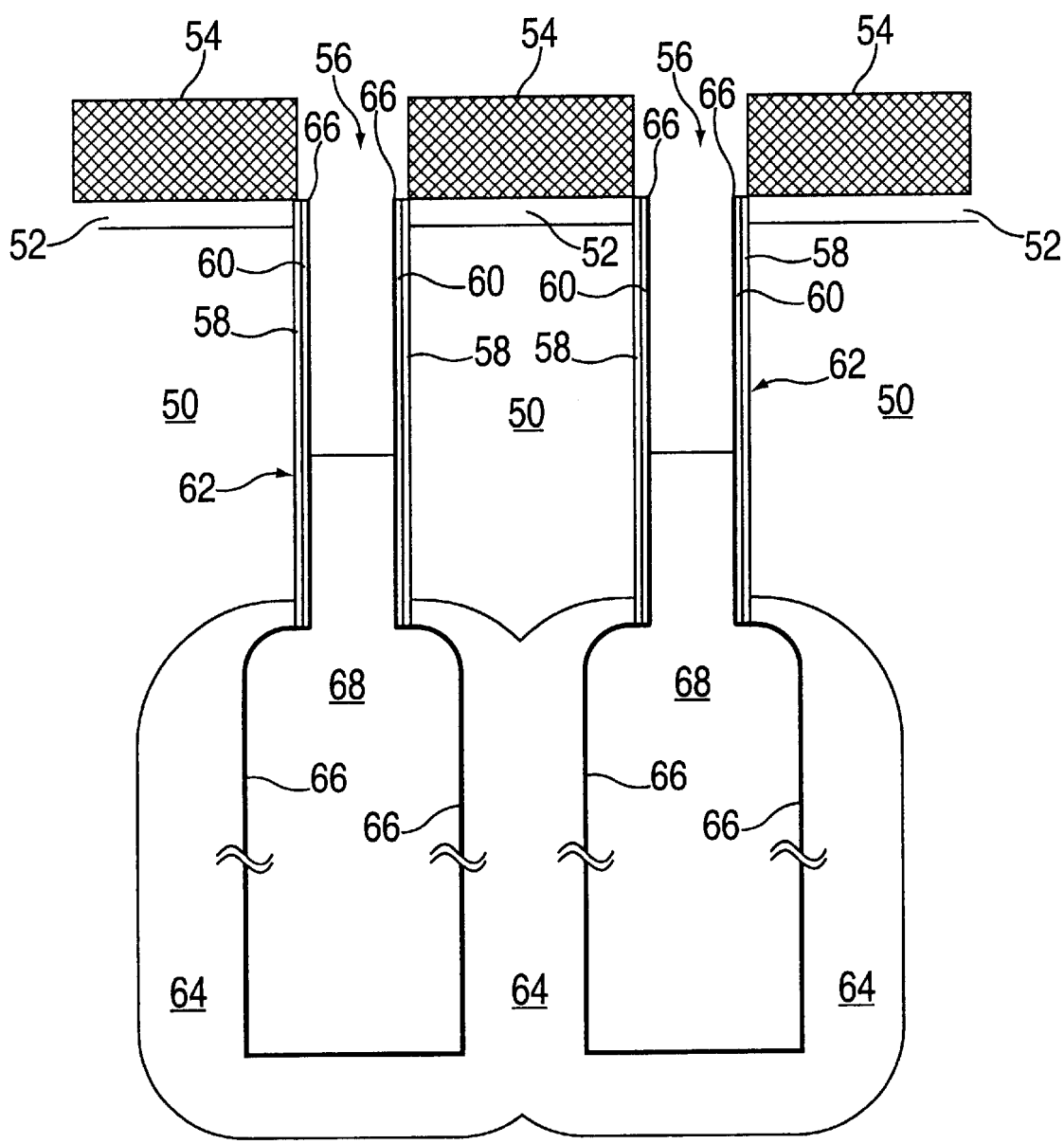

The resultant structure that is formed after formation of the node dielectric and recessed storage capacitor node conductor is shown, for example, in FIG. 4. Note that in FIG. 4, the upper sidewalls of each trench includes a material stack that consists of node dielectric 66, and sacrificial isolation collar 62.

Figure 5:
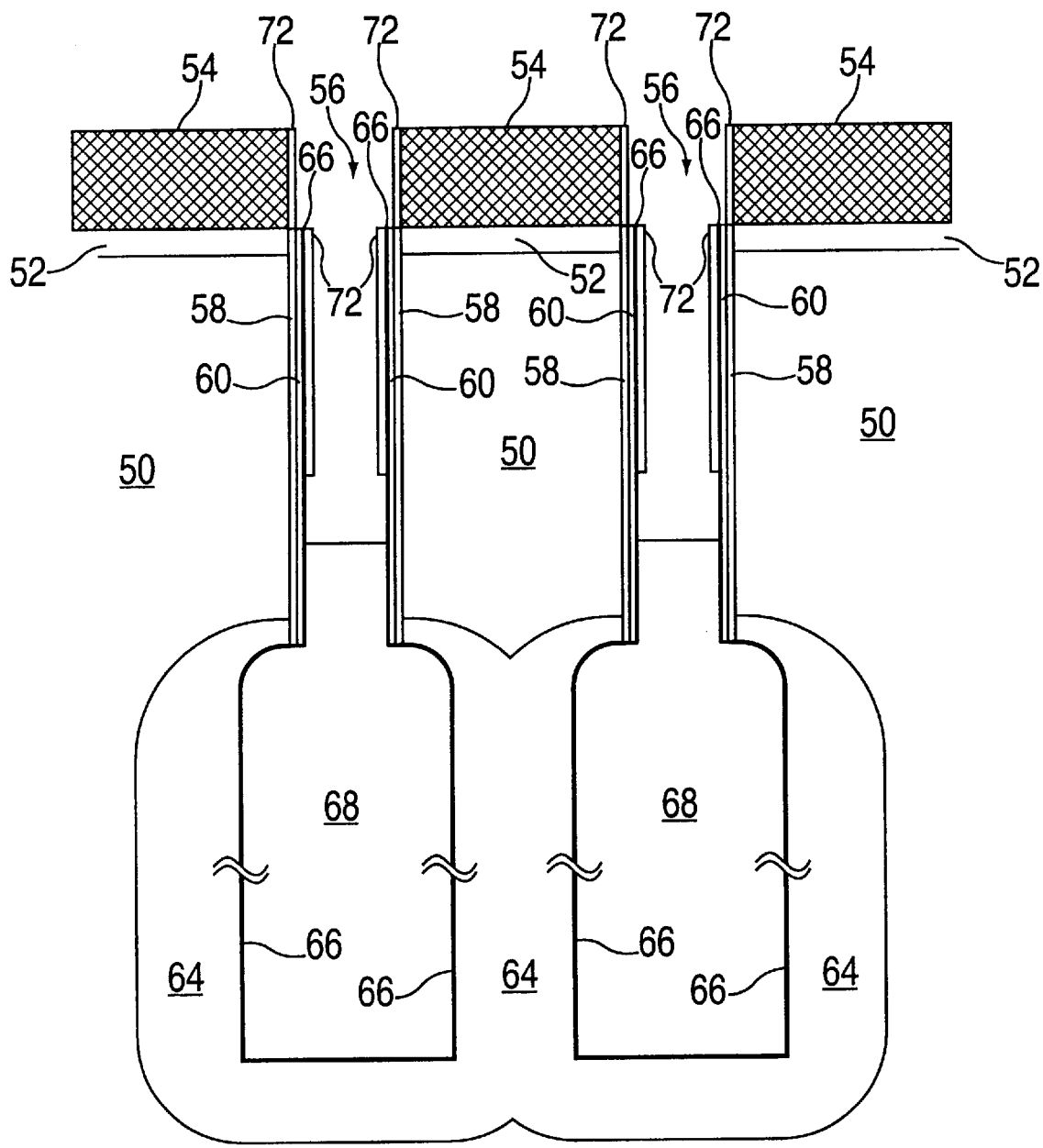

Next, and as shown in FIG. 5, sacrificial oxide layer 72 is formed in each trench including exposed surfaces of the node dielectric and the exposed horizontal surface of recessed storage capacitor node conductor 68 using a conventional deposition process. The sacrificial oxide is the removed from the exposed horizontal surface of the recessed storage capacitor node conductor using a reactive-ion etching process that selectively removes oxide as compared to either the node conductor or node dielectric. The exposed recessed storage capacitor node conductor is then recessed a second time providing the structure shown in FIG. 5. Note that in this figure, the second recessing exposes a portion of the node dielectric in the narrow upper section of each trench.

Figure 6:
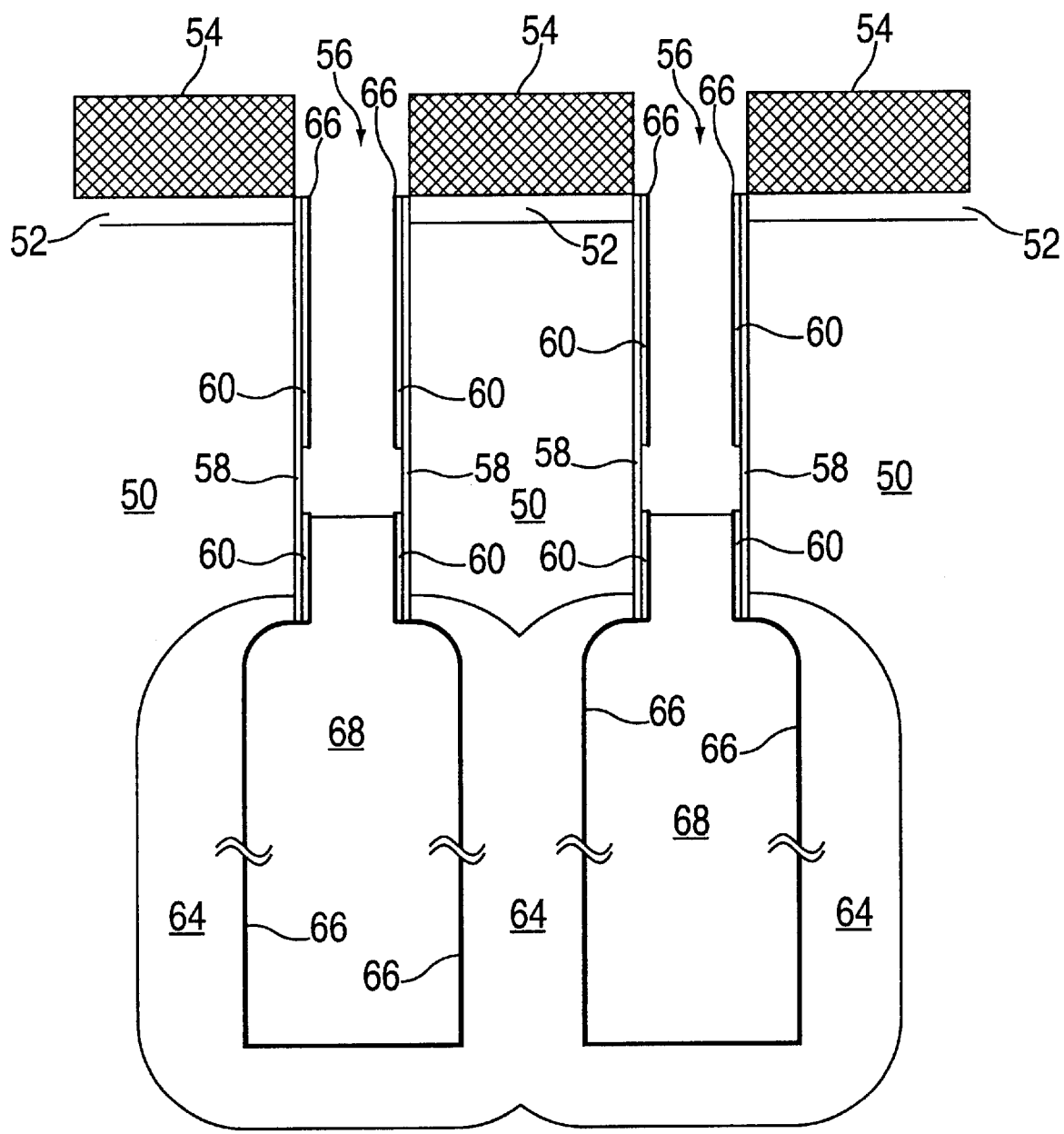
Figure 7:
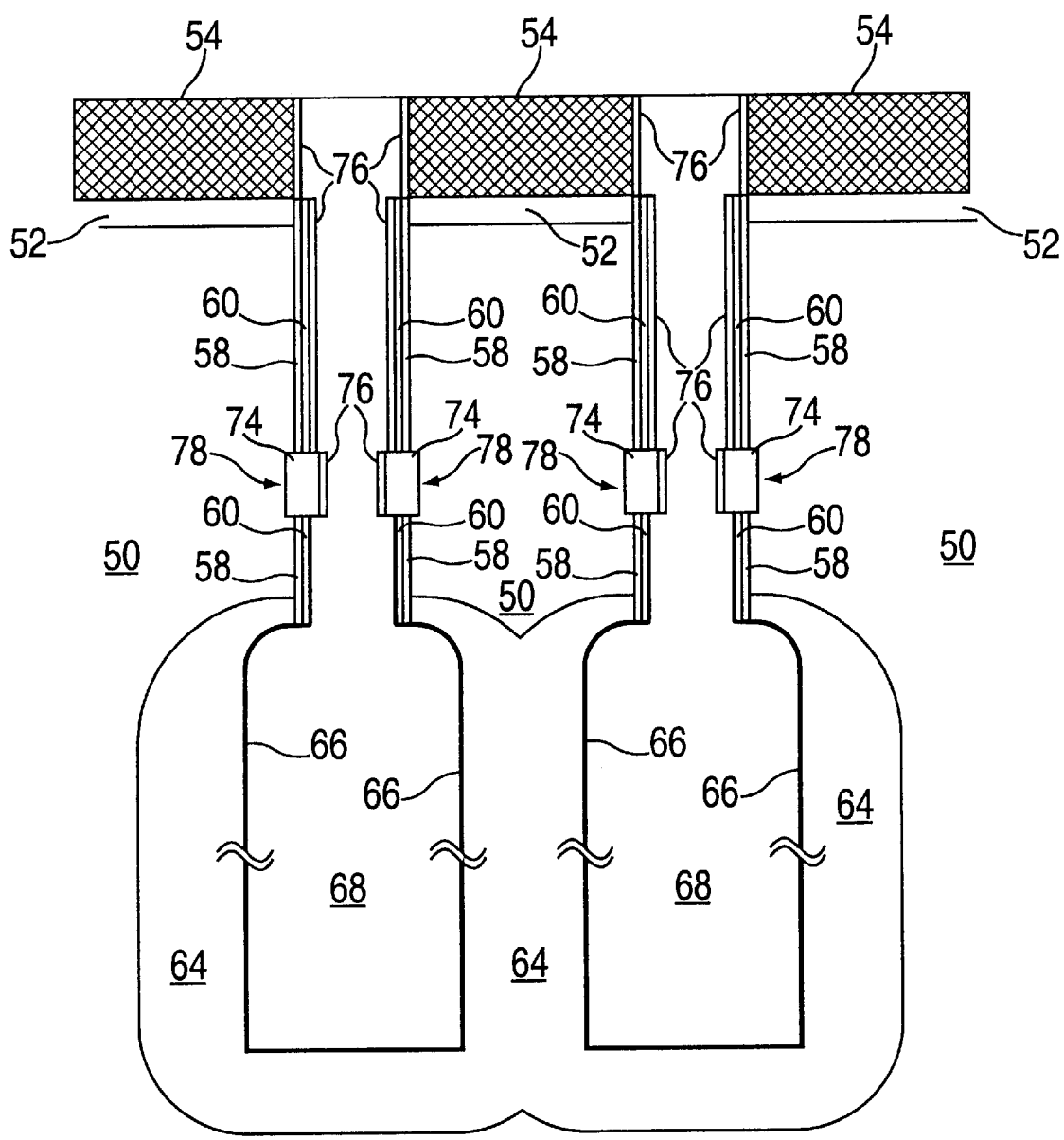

Any node dielectric that is not protected with sacrificial oxide layer 72 is then removed using an etching process that is selective in removing node dielectric from each trench and thereafter, any exposed oxide surface, including sacrificial oxide layer 72 and $SiO_2$ layer 60 of sacrificial collar isolation region 62, is removed using a conventional oxide stripping process so as to provide the structure shown, for example, in FIG. 6. Note that in this structure, a portion of SiN layer 58 and node dielectric layer 66 are now exposed.

Exposed SiN layer 58 and optionally, node dielectric layer 66, may now be removed using an etching process that is highly selective in removing nitride from the trench as compared to oxide. This step provides an opening to the trench sidewalls in which the inventive collar isolation region will be subsequently formed.

The thick portion of the collar isolation region (labeled as 74 in FIG. 7) is formed using a collar oxidation process that is performed in an oxidizing ambient such as $O_2$ or ozone at a temperature of about 800° C. or higher. Thick collar isolation region 74 is a thermal oxide that has a thickness of from about 50 to about 300 Å, with a thickness of from about 150 to about 250 Å being more highly preferred. The vertical length of the thick collar portion is less than about 0.50 μm, with a vertical length of from about 0.2 to about 0.4 μm being more highly preferred. Note that the thick thermal portion of the collar isolation region is formed partially outside the trench, and partially inside the trench.

If not previously carried out, any remaining node dielectric may now be optionally removed from the upper portion of each trench using an etching process that is highly selective in removing node dielectric as compared to oxide. Deposited oxide or a low-k dielectric (having a dielectric constant less than $Si_3N_4$) 76 is then formed using a conventional deposition process. Portions of the deposited oxide or low-k dielectric that are formed atop the thick thermal oxide formed above represent the thin portion of the inventive collar isolation region of the present invention. In the drawings, the inventive collar isolation region is labeled as 78. Note that the vertical length of the inventive collar oxide is relatively short (0.5 μm) and that the inventive collar isolation region does not choke off the cross-sectional area of the trench. Note that the deposited oxide of low-k dielectric are formed inside the trench.

Oxide that is formed atop the horizontal surface of the twice recessed storage capacitor node conductor during the thermal growing process of the thick oxide and the deposition of the thin oxide or low-k dielectric is then removed using a reactive-ion etching process. Each trench is then refilled with storage capacitor node conductor material 68 and planarized to the upper surface of pad layer 54.

Next, vertical MOSFETs 80 are formed in each trench above underlying trench capacitor 70 using standard processing steps well known to those skilled in the art. This includes recessing storage capacitor node conductor 68 for a third time to a depth in which buried strap diffusion regions 86 will be formed. Remaining deposited or low-k dielectric material 76 is then removed from the upper portion so as to expose the upper trench sidewalls. Next, a doped conductor region (not separately labeled) such as N+ poly is formed in the lower portion of the recess in the trench and dopant is diffused through an opening at the exposed sidewalls forming N+ buried strap regions 86. Trench top oxide 88 is formed on the doped conductor using a conventional deposition process. A vertical gate dielectric such as $SiO_2$ (labeled as 82 in the figures) is then formed on the exposed trench walls using a thermal growing process or a conventional deposition process and thereafter, a gate conductor material 84 such as poly Si, a metal or a metallic silicide is formed atop the trench top oxide providing the structure shown in FIG. 2. Note that in the structure illustrated in FIG. 2 the pad layer is removed from the surface of substrate 50 using a conventional stripping process that is capable of removing the pad layer therefrom. Further processing may continue so as to form wordlines, bitline contacts, etc.

The advantage of the inventive process flow over prior art collar processes is that a combination of thermal oxide and deposited oxide is used in forming the inventive collar isolation region. Since the thick part of the collar is buried below the surface of the Si-containing substrate, the thermal oxidation step mentioned above can be employed without consuming Si at the top of the trenches. This step creates only limited reduction of trench diameter since a portion thereof is formed outside the trench walls. The addition of the thin deposited oxide or low-k dielectric layer ensures the necessary collar thickness such that the vertical parasitic transistor is not switched on.

The minimum length of the thick portion of the collar is constrained by the short channel effect of the vertical parasitic. At the onset of vertical conduction, the Si under the thin portions of the collar (on each side of the thick portion) is inverted. These inversion regions behave as pseudo source/drains. The minimum length of the thick portion of the collar is limited by the field penetration from the pseudo drain to the pseudo source through the thicker portion of the collar is approximately 0.20 $\mu$m.

The locally thicker portion of the collar is most effective in raising the threshold voltage of the vertical parasitic if placed at the point of the maximum P-well concentration between the strap outdiffusion and the N-band (buried plate).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A trench capacitor memory cell structure comprising:
   a plurality of trenches present in a semiconductor substrate, each of said plurality of trenches including a vertical transistor isolated from an underlying trench capacitor, and
   a vertical collar isolation region having a vertical length of about 0.50 $\mu$m or less present on sidewalls of each trench between said vertical transistor and said trench capacitor, said collar isolation region having a first portion that is present partially outside the trench and a second portion that is present inside the trench, said first portion is thicker than said second portion thereby reducing current leakage of an adjacent vertical parasitic transistor.

2. The trench capacitor memory cell structure of claim 1 wherein said vertical transistor comprises a vertical gate dielectric, a gate conductor and source/drain regions.

3. The trench capacitor memory cell structure of claim 2 wherein said source/drain regions of said vertical transistor comprise an N+ bitline diffusion region and an N+ buried strap region.

4. The trench capacitor memory cell structure of claim 1 wherein said trench capacitor comprises an N+ buried plate diffusion region, a node dielectric and a storage capacitor node conductor.

5. The trench capacitor memory cell structure of claim 1 further comprises a trench top oxide layer that isolates said vertical transistor from said trench capacitor.

6. The trench capacitor memory cell structure of claim 1 further comprises an N+ buried strap diffusion region which is present outside the trench, said N+ buried strap diffusion region provides electrical communication between the vertical transistor and the trench capacitor.

7. The trench capacitor memory cell structure of claim 1 wherein said vertical length of said vertical collar isolation region is from about 0.2 to about 0.4 $\mu$m.

8. The trench capacitor memory cell structure of claim 1 wherein said first portion is comprised of a thermal oxide.

9. The trench capacitor memory cell structure of claim 1 wherein said second portion is comprised of a deposited oxide.

10. The trench capacitor memory cell structure of claim 1 wherein said second portion is a dielectric material that has a dielectric constant lower than $Si_3N_4$.

11. The trench capacitor memory cell structure of claim 1 wherein said first portion is a thermal oxide and said second portion is a dielectric material that has a dielectric constant lower than $Si_3N_4$.

12. A method of forming a trench capacitor memory cell structure, said method comprising the steps of:
   providing a plurality of trenches in a surface of a semiconductor substrate, each of said plurality of trenches having an upper region and a lower region, said lower region containing a trench capacitor formed therein;
   forming a vertical collar isolation region in each of said trenches, said vertical collar isolation region having a vertical length of about 0.50 $\mu$m or less and a first portion that is present partially outside the trench and a second portion that is present inside the trench, said first portion is thicker than said second portion;
   forming a vertical transistor above said vertical collar isolation region.

13. The method of claim 12 wherein said trenches are formed by lithography and etching using a pad layer as a trench mask.

14. The method of claim 12 wherein said first portion of said vertical collar isolation region is formed by a thermal oxidation process.

15. The method of claim 14 wherein said thermal oxidation process is performed in an oxidizing ambient and at a temperature of about 800° C. or above.

16. The method of claim 12 wherein said second portion is formed by a deposition process.

17. The method of claim 12 wherein said trench capacitor is formed by the steps of diffusing N+ dopant from said trenches into a lower portion of each trench, lining trench walls in said lower portion with a node dielectric and filling at least said lower portion of each trench with a storage capacitor node conductor.

18. The method of claim 12 further comprising forming a trench top oxide layer over said trench capacitor so as to isolate said trench capacitor from said vertical transistor.

19. The method of claim 12 wherein said vertical transistor is formed by providing a vertical gate dielectric on at least upper sidewalls of each trench, and filling said trench with a gate conductor.

20. The method of claim 12 further comprising forming N+ bitline diffusion regions in said semiconductor substrate, said N+ bitline diffusion regions abutting each trench.

* * * * *